United States Patent [19]

Hosotani et al.

[11] Patent Number: 4,912,470
[45] Date of Patent: Mar. 27, 1990

[54] AD CONVERTER

[75] Inventors: Shiro Hosotani; Takahiro Miki, both of Hyogo, Japan

[73] Assignee: Mitsubishi Denki Kabushiki Kaisha, Tokyo, Japan

[21] Appl. No.: 260,130

[22] Filed: Oct. 18, 1988

[30] Foreign Application Priority Data

Oct. 19, 1987 [JP] Japan ................................ 62-264157

[51] Int. Cl.[4] ........................................... H03M 1/36
[52] U.S. Cl. ..................................... 341/159; 341/156
[58] Field of Search ............... 341/159, 156, 158, 155, 341/118

[56] References Cited

U.S. PATENT DOCUMENTS

| | | | |
|---|---|---|---|
| 4,612,531 | 9/1986 | Dingwall et al. | 341/156 |
| 4,635,036 | 1/1987 | Yoshizawa | 341/156 |
| 4,719,447 | 1/1988 | Garuts | 341/159 |

OTHER PUBLICATIONS

*Data Acquisition* of Analog Devices Inc., the third edition published Jul., 1986, pp. 10-345.

Primary Examiner—William M. Shoop, Jr.
Assistant Examiner—Sharon D. Logan
Attorney, Agent, or Firm—Lowe, Price, LeBlanc, Becker & Shur

[57] ABSTRACT

A serial-parallel type AD converter comprises a first parallel type AD converting portion determining a higher order bit of a digital signal, a second parallel type AD converting portion determining a lower order bit of the digital signal and error correcting circuit. In the first parallel type Ad converting portion, a shifter is connected between a first determining circuit and a first encoder. In the second parallel type AD converting portion, a selector is connected between three second voltage comparator groups and a second determining circuit. The error correcting circuit applies control signals to the shifter and the selector for correcting errors derived from sampling skew of analog input voltages. The shifter determines the connection between the first determining circuit and first encoder in response to the control signal. The selector connects one of the three voltage comparator groups to the second determining circuit in response to the control signal.

9 Claims, 10 Drawing Sheets

| $R_0R_1$ | $\overline{R_0}R_1$ | $R_0\overline{R_1}+R_1\overline{R_0}$ | $R_0$ | $R_1$ |
|---|---|---|---|---|
| 1 | 0 | 0 | 1 | 1 |

CONTROL SIGNAL

| 4a | 4b | 4c |
|---|---|---|
| 0 | 1 | 1 |

COMPARATOR OUTPUT = 2

×

| R0 | R1 |
|---|---|
| 1 | 1 |

DIGITAL INPUT = 3

=

| 6a | 6b | 6c | 6d |
|---|---|---|---|
| 0 | 1 | 1 | 0 |

ENCODE OUTPUT = 6

4,912,470

AD CONVERTER

BACKGROUND OF THE INVENTION

1. Field of the Invention

The present invention relate to an AD converter converting analogue input voltage to digital signals and, more specifically, it relates to a serial-parallel type AD converter capable of high speed operation having an enlarged analogue input band.

2. Description of the Prior Art

FIG. 1 is a block diagram showing one example of the conventional serial-parallel type AD converter disclosed in, for example, a catalog of Micro Power Systems Incorporated, "One Chip 11 Bit CMOS Flash A/D Converter MP7685 Long Desired in the Industry". FIG. 1 shows an AD converter of 4 bit structure.

The A/D converter is constituted by a first parallel type AD converting portion 1 for determining higher order bits of the digital output, and a second parallel type AD converting portion 2 for determining lower order bits thereof.

The first parallel type AD converting portion 1 comprises three first voltage comparators CC1~CC3, a first determining circuit J1, a first encoder E1 and a first reference voltage generating circuit RG comprising resistances R1~R16 and a constant voltage source 3. The second parallel type AD converting portion is constituted by three second voltage comparators FC1~FC3, a second determining circuit J2, a second encoder E2 and a switch control circuit SCC forming a second reference voltage generating circuit. The switch control circuit SCC comprises switches S1~S12 connected to the first reference voltage generating circuit RG comprising the resistances R1~R16 and a constant voltage source 3.

In the first parallel type AD converting portion 1, the voltage V11 generated between the resistances R4 and R5, the voltage V12 generated between the resistances R8 and R9, and the voltage V13 generated between the resistances R12 and R13 are respectively supplied to the first voltage comparators CC1~CC3 as reference voltages. In the second parallel type AD converting portion, voltages obtained from respective nodes between the serially connected resistances R1~R16 through the switches S1~S12 forming the switch control circuit SCC are respectively applied to the second voltage comparators FC1~FC3 as reference voltages V21, V22 and V23. The reference voltage V21 is provided from one of the switches S1, S4, S7 and S10; the reference voltage V22 is provided from one of the switches S2, S5, S8 and S11; and the reference voltage V23 is provided from one of the switches S3, S6, S9 and S12.

The resistances R1~R16 are divided into four resistance groups RG1~RG4, respectively constituted by resistances R1~R4, resistances R5~R8, resistances R9~R12 and resistances R13~R16. In correspondence with the resistance groups RG1~RG4, the switches S1~S12 are divided into four switch groups SG1~SG4, respectively constituted by switches S1~S3, switches S4~S6, switches S7~S9 and switches S10~S12. One of the switch groups SG1~SG4 operates in response to a signal from the first determining circuit J1 at the first parallel type AD converting portion 1. Consequently, reference voltages V21, V22 and V23 are respectively supplied to the second voltage comparators FC1~FC3.

FIG. 2A is a circuit diagram showing one example of a definite structure of each of the first voltage comparators CC1~CC3 shown in FIG. 1.

Each of the voltage comparators CC1~CC3 comprises an input stage I, an amplifying stage Z and a latch stage L. One input terminal 4 of the input stage 1 receives an analogue input voltage and the other input terminal 5 receives ay one of the reference voltages V11, V12 and V13. The input terminal 4 is connected to one electrode of a coupling capacitance 6 through the switch S13 which turns on/off in response to a clock signal $\phi 1$ The input terminal 5 is connected to the same electrode of the coupling capacitance 6 through the switch S14 which turns on/off in response to a clock signal $\phi 1$. The other electrode of the coupling capacitance 6 is connected to an input terminal of an inverting amplifier 7. The inverting amplifier 7 has its output terminal connected to the input terminal of itself through the switch S15 which turns on/off in response to a clock signal $\phi 2$. The output terminal of the inverting amplifier is also connected to an input terminal of an inverting amplifier 8 in the succeeding stage. The inverting amplifier 8 has its output terminal connected to an input terminal of an inverting amplifier 9 through the switch 16 which turns on/off in response to a clock signal $\overline{\phi 2}$. The output terminal of the inverting amplifier is also connected to an input terminal of an inverting amplifier 10 of the succeeding stage. An output terminal of the inverting amplifier 10 is connected to an output terminal 11 and is fed back to the input terminal of the inverting amplifier 9 through the switch S17 which turns on/off in response to the clock signal $\phi 2$.

FIG. 2B is a circuit diagram showing one example of a definite structure of the second voltage comparators FC1~FC3 shown in FIG. 1.

The circuit structure of the voltage comparators FC1~FC3 is almost the same as that of the voltage comparators CC1~CC3 shown in FIG. 2A. The switches S18~S21 correspond to the switches S13, S15~S17 of FIG. 2A, and the inverting amplifiers 13~16 correspond to the inverting amplifiers 7~10 of FIG. 2A. The coupling capacitance 12 corresponds to the coupling capacitance 6 of FIG. 2,, the input terminal 18 corresponds to the input terminal 5 of FIG. 2A, and the output terminal 17 corresponds to the output terminal 11 of FIG. 2A. Different from the circuit of FIG. 2A, one of the reference voltages V21, V22 and V23 is applied to the input terminal 18. The input terminal 18 is directly connected to the coupling capacitance 12 and not through the switch S14 as shown in FIG. 2A. The switches S18, S19 and S21 turn on/off in response to the clock signal $\overline{\phi 1}$, and the switch 20 turns on/off in response to the clock signal $\phi 1$.

The AD converter shown in FIG. 1 operates as described in the following.

Referring to FIG. 1, when an analog input voltage Vin is inputted to the input terminal 4, the analog input voltage Vin is compared with the reference voltages V11, v2 and V13 respectively by the first voltage comparators CC1~CC3. When the analog input voltage Vin is midway between the reference voltages V11 and V12, for example, the output from the voltage comparators CC2 and CC3 become "L" level, and the output from the voltage comparator CC1 becomes "H" level. The output data are inputted to the first determining circuit J1. Consequently, the output of the first determining circuit J1 will be "0", "0", "1" and "0". The output from the first determining circuit J1 are encoded by the first encoder (encoding circuit) E1. Thus the first AD conversion of the analog input voltage Vin to digital code is carried out.

Thereafter, the switches S4~S6 of the switch group SG2 provided between the reference voltages V11 and V12 are turned on in response to the signal from the first determining circuit J1. Consequently, reference voltages V21, V22 and V23 are respectively applied to the second voltage comparators FC1~FC3. The analog input voltage Vin is compared with the reference voltages V21, V22 and V23 respectively by the voltage comparators FC1~FC3. When the analog input voltage Vin exists between the reference voltage V21 and V22, for example, the outputs of the voltage comparators FC2 and FC3 become "L" level, and the output of the voltage comparator FC1 becomes "H" level. The output data of the voltage comparators FC1~FC3 are inputted to the second determining circuit J2, and the output of the second determining circuit J2 will be "0", "0", "1" and "0". The outputs from the second determining circuit J2 are encoded in the second encoder E2. Thus the second AD conversion is carried out.

The principle of operation of the first voltage comparators CCj (j=1~3) (FIG. 2A) in the above operation will be described in the following.

As shown in a timing chart of FIG. 3A, while the clock signals $\phi_1$ and $\phi_2$ are at "H" level, the switch S14, S15 and S17 are on, and the switches S13 and S16 are off. In this case, a short circuit is generated between the input terminal and the output terminal of the inverting amplifier 7 in the amplifying stage Z, and the inverting amplifier 7 is biased to a certain potential $V_{B1}$. The potential biased in this manner will be hereinafter referred to as "balance potential". The above described operation mode in the amplifying stage Z will be referred to as "auto zero mode". Therefore, in the auto zero mode, the coupling capacitance 6 is charged by any one of the reference voltages V11~V13 applied to the input terminal and the balance potential $V_{B1}$ of the inverting amplifier 7. Since the switch S16 is off at this time, the amplifying stage Z and the latch stage L are cut off from each other.

While the clock signals $\phi_1$ and $\phi_2$ are at "L" level and the complementary clock signals $\overline{\phi_1}$ and $\overline{\phi_2}$ are at the "H" level, the switches S13 and S16 are on, the switches S14, S15 and S17 are off. On this occasion, the analog input voltage Vin is applied from the input terminal 4 to the input side electrode of the coupling capacitance 6. Since the switch S15 is off, the flowing in and out of charges to and from the path of the switch S15 are prevented, and the charges stored in the auto zero mode are reserved. Therefore, the change of voltage from the reference voltage take place at the input side electrode of the coupling capacitance 6 is transmitted to the output side electrode of the coupling capacitance 6 with correct polarization, provided that there is no error caused by clock noise or the like, and the voltage amplitude from the balance potential is amplified by inverting amplifiers 7 and 8. This operation mode of the amplifying stage Z will be hereinafter referred to as "comparing mode". The change of the voltage amplified by the amplifying stage Z is applied to the latch stage L through the switch S16, and it is further amplified by two inverting amplifiers 9 and 10. This operation of the latch stage will be hereinafter referred to as "through mode".

When the clock signals $\phi_1$ and $\phi_2$ again become "H" level, the switch S16 turns off and the switch S17 turns on. The amplifying stage Z enters auto zero mode. On this occasion, the amplified input voltage change is fedback to the input terminal of the inverting amplifier 9 through the switch S17 to be latched. This operation of the latch stage L will be hereinafter referred to as "latch mode". In this manner, in the latch mode, the input voltage change is amplified so large as to enable the output of the latch stage L to reach the logic level, and it is outputted as a digital value. Namely, the magnitude of the analog input voltage Vin is compared with the magnitude of each of the reference voltages V11~V13, with the result of comparison outputted as a digital value.

The principle of operation of the second voltage convertors FCj (J=1~3) (FIG. 2B) will be described in the following with reference to the timing chart of FIG. 3B.

The principle of operation of the second voltage comparators FCj shown in FIG. 2B is the same as that of the first voltage comparators CCj shown in FIG. 2A except for the operation timing of each operation mode. More specifically, in the case of the second voltage comparators FCj, the analog input voltage Vin is taken in from the input terminal 4 while the clock signal $\phi_1$ is at "H" level, that is, the clock signal $\overline{\phi_1}$ is at "L" level. At that time, the amplifying stage Z enters the auto zero mode, and the latch stage L enters the latch mode. While the clock signal $\overline{\phi_1}$ is at the "H" level, the amplifying stage Z is in the comparing mode, and the latch stag L is in the through mode.

The reference voltages V21~V23 to be applied to the second voltage comparators FCj are applied to the input terminal 18 only during the period when the clock signal $\phi_2$ is at "H" level. This operation is effected in the following manner. Namely, a control signal applied from the first determining circuit J1 shown in FIG. 1 to the switch groups SG1~SG4 is controlled by the clock signal $\phi_2$ applied to the first determining circuit J1. Therefore, one of the switch groups SG1~SG4 is turned on only when the clock signal $\phi_2$ is in the "H" level, and all switches S1~S12 are off while the clock signal $\phi_2$ is at the "L" level.

In this manner, it is detected that the analog input voltage Vin is between the reference voltage V11 and V12, for example, and a higher order bit digital code is provided in the first parallel type AD converting portion 1. Thereafter, since the switch group SG2 is turned on, the AD conversion for obtaining higher resolution is carried out in the second parallel type AD converting portion 2. The lower order bit digital code can be provided therefrom.

As described above, the reference voltage to be applied to the second parallel type AD converting portion 2 cannot be obtained until the comparing operation of the first parallel type AD converting portion 1 is completed. Therefore, the timing of the operation mode of the second voltage comparators FCj included in the second parallel type AD converting portion 2 (FIG. 3B) is different from that of the first comparators CCj included in the first parallel type AD converting portion 1 (FIG. 3A).

Actually, the analog input voltage Vin changes at random, causing skew, that is, off set of timing, generated in sampling the analog input voltage Vin in the first and second parallel type AD converting portions 1 and 2. The samplings skew degrades the performance precision of the AD convertor. This problem will be described in the following.

The first voltage comparator CCj included in the first parallel type AD convertor 1 is in the comparing mode during sampling of the analog input voltage Vin from the input terminal 4, as shown in FIG. 3A. Namely, the switches S15 and S17 are turned off and the switch S16 is turned on. Consequently, the change in the analog input voltage Vin is transmitted to the latch stage L with some delay T1 derived from the coupling capacitance 6 and from the inverting amplifiers 7~10. More specifically, the analog input voltage Vin sampled at the time t0 is latched in the latch stage L at the time t2. The conversion to the digital code in the first parallel type AD converting portion 1 is carried out based on the result of comparison of the analog input voltage Vin reached the latch stage L reference voltages B11~B13. Therefore, the analog input voltage Vin sampled at the time t0 is converted into the digital code at the time t2.

On the contrary, the second voltage comparator FCj included in the second parallel type AD converting portion 2 enters the auto zero mode during sampling of the analog input voltage Vin from the input terminal 4, as shown in FIG. 3B. Namely, the switches S19 and S21 turn on, while the switch S20 turns off. Consequently, an input side node of the coupling capacitance 12 changes along the change of the analog input voltage Vin. A relatively small delay is incidental to the change. Therefore, in the second parallel type AD converting portion 2, the analog input voltage Vin applied at the time t2 when the switch S18 of the second voltage comparator FCj is turned off is converted into the digital code. The time of sampling of the analog input voltage Vin which is to be actually converted to the digital code at the first parallel type AD converting portion 1 and at the second parallel type AD converting portion 2 is shifted by the above mentioned delay time T1. For example, when a ramp wave having the frequency of 5 MHz is applied as the analog input voltage Vin and the delay time T1 is assumed to be 10 NS, the sampling point of the analog input voltage Vin which is actually converted into the digital code in the first parallel type AD converting portion and in the second parallel type AD converting portion 2 differs from each other by 10 ns. The difference is represented by the voltage value of 12.8 LSB, and therefore, the data different from each other by 12.8 LSB are sampled.

In an actual serial-parallel type AD convertor, timing adjustment is carried out by, for example, shifting the timing of turning off the switch S13 and the timing of turning off the switch S16 in the first voltage comparator CCj (FIG. 2A) by the time Td (=T1) as shown in the timing charge of FIG. 4, whereby the skew in sampling analog input voltage Vin between the first and second parallel type AD converting portion 1 and 2 can be compensated for.

In a conventional AD convertor, the sampling skew of the analog input voltage Vin is corrected only by the shifting the timing of latch in the first voltage comparator CCj included in the first parallel type AD converting portion 1.

However, when the time td is large, the time period in which the clock signal $\phi 2$ is at "H" level is reduced. The second voltage comparator FCj of the second parallel type Ad convertor portion 2 must effect the comparing mode in the short period. However, actually the second voltage comparator FCj requires a relatively long period of time to effect the comparing mode. Therefore, in order to provide enough time td the frequencies of the clock signals $\phi 1$ and $\phi 2$ must be lowered. Consequently, in the above described method of correcting skew in sampling analog input voltage Vin by shifting the timing of the clock signals is disadvantages in increasing the speed of conversion of the AD convertor and in the enlargement of the analog input band.

SUMMARY OF THE INVENTION

One object of the present invention is to provide an AD convertor capable of high speed and precise operation.

Another object of the present invention is to provide an AD convertor capable of operating in a wide analog input band.

A further object of the present invention is to provide an AD convertor in which sampling skew of analog input voltage can be corrected without reducing the speed of operation and without preventing the enlargement of the analog input band.

A still further object of the present invention is to provide an AD convertor in which the sampling skew of analog input voltage can be corrected before encoding to the digital code.

In order to attain the above describe objects, the AD convertor in accordance with present invention comprises a first parallel type AD converting portion, a second parallel type AD converting portion and error collecting means.

The first parallel type AD converting portion comprises first reference voltage generating means, a plurality of first voltage comparing means, first determining means, first encoder means, and first connection determining means. The first reference voltage generating means equally divides a prescribed reference voltage to provide a plurality of first reference voltages. Each of the plurality of first voltage comparing means compares an analog input voltage with each of the plurality of first reference voltages. The first determining means detects the first voltage range to which the analog input voltage belongs out of the plurality of first voltage ranges distinguished by the plurality of first reference voltages, in response to outputs from the plurality of first voltage comparing means. The first encoder means determines higher order bits of the digital signal in response to the output of the first determining means. The first connection determining means is provided between the first determining means and first encoder means to determine the relation of connection therebetween.

The second parallel type AD converting portion comprises second reference voltage generating means, a plurality of second voltage comparing means, the second determining means and second encoder means. The second reference voltage generating means further divides equally the voltage range including the first voltage range detected by the first determining means, to provide a plurality of second reference voltages. Each of the plurality of second voltage comparing means compares the analog input voltage with each of the plurality of second reference voltages in a second manner of operation. The second determining means detects a second voltage range to which the analog input voltage belongs out of the plurality of second voltage ranges distinguished by the plurality of second reference voltages, in response to outputs from the plurality of second comparing means. The second encoder means determines lower order bits of the digital signal in response to the output of the second determining means.

The error correction means comprises selecting means, a plurality of third voltage comparing means and third determining means. The selecting means selects first reference voltages encompassing the first voltage range detected by the first determining means out of the plurality of first reference voltages. Each of the plurality of third voltage comparing means compares the analog input voltage with each of the first reference voltage selected by the selecting means in the second manner of operation as did the second voltage comparator. The third determining means detects a first voltage range to which the analog input voltage belongs out of the plurality of first voltage ranges distinguished by the first reference voltage selected by the selecting means, in response to outputs of the plurality of third voltage comparing means, and applies a control signal for determining the connection relation to the first connection determining means.

Since the manner of operation of the third voltage comparing means is the same as that of the second voltage comparing means in the present invention, there is no sampling skew between the second voltage comparing means and the third voltage comparing means. The third voltage comparing means compares the analog input voltage with the first reference voltages selected to include the voltage range of the analog input voltage determined by the output of the first voltage comparing means. The third determining means detects which of the voltage ranges distinguished by the first reference voltage the actual analog input voltage belongs to, based on the result of comparison. Therefore, the error derived from the sampling skew between the first voltage comparing means and the second voltage comparing means can be detected. The third determining means determine the connection between the first determining means and the first encoder means based on the result of detection. A digital signal with the error derived from the sampling skew corrected is outputted from the first parallel type AD converting portion.

As describe above, according to the present invention, a voltage range to which the actual analog input voltage belongs is detected by the error correcting means out of the voltage ranges distinguished by the first reference voltages selected to include the voltage range of the analog input voltage detected by the first AD converting process. Consequently, the error derived from the sampling skew between the first parallel type AD converting portion and the second parallel type AD converting portion can be detected, and the digital output of the first parallel type AD converting portion is corrected based on the result of detection. Therefore, the error derived from the sampling skew can be corrected without shifting the timing of the clock signal, that is, the timing of latch, whereby precise operation at high speed become possible in a wide analog input band.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in detail with reference to the figures.

Figure 5:
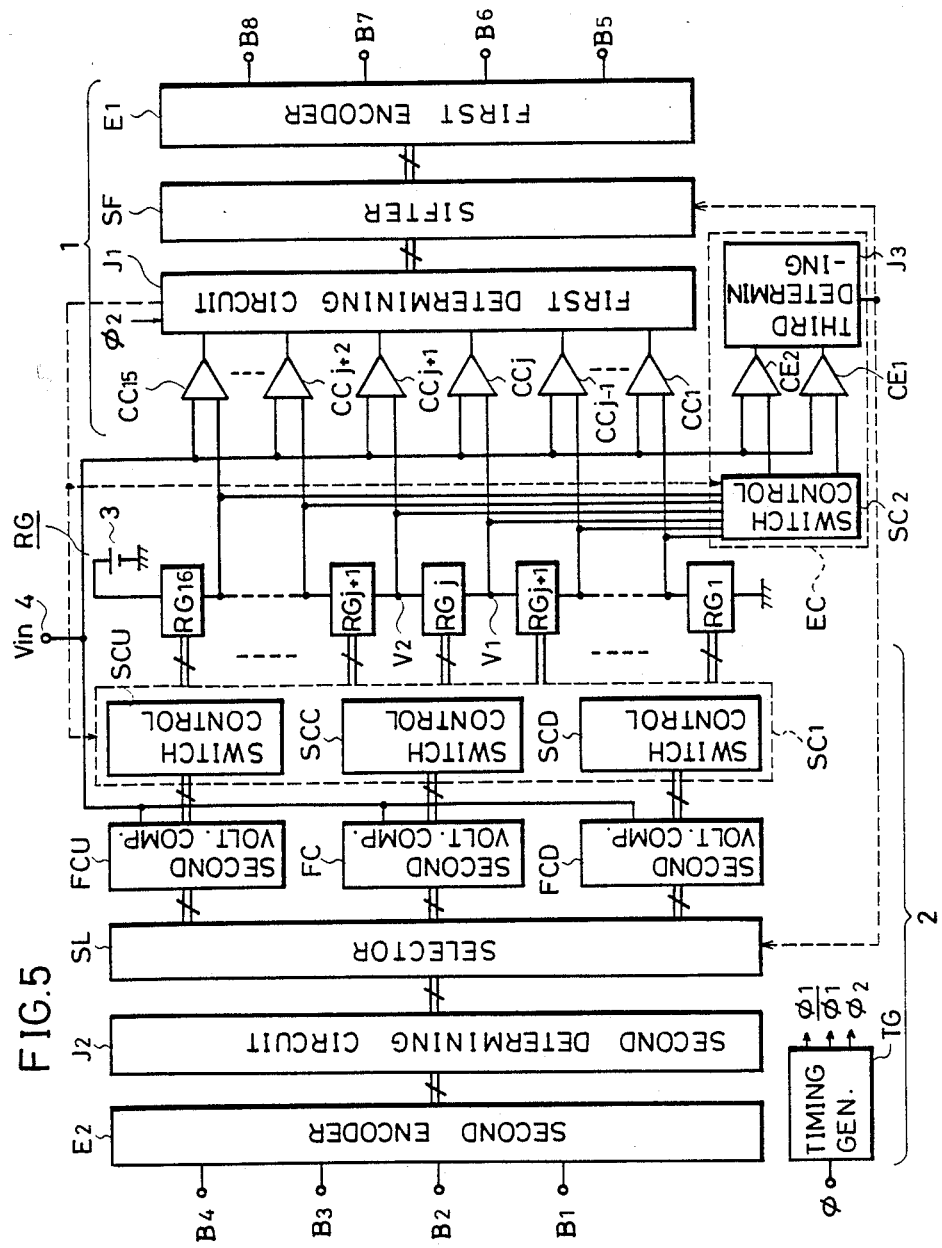
FIG. 5 is a block diagram showing a structure of the AD converter in accordance with one embodiment of the present invention.

FIG. 5 is a block diagram showing the structure of the AD converter in accordance with one embodiment of the present invention. That AD converter of the present embodiment is an 8 bit serial parallel type AD converter.

The first voltage comparators $CC1 \sim CC15$, the first determining circuit J1, the first encoder E1, the first reference voltage generating circuit RG, the second voltage comparator group FC, the second determining circuit J2, the second encoder E2 and the switch control circuit SCC constituting the second reference voltage generating circuit are essentially the same as those in the conventional AD converter of 4 bit structure.

Figure 2A:
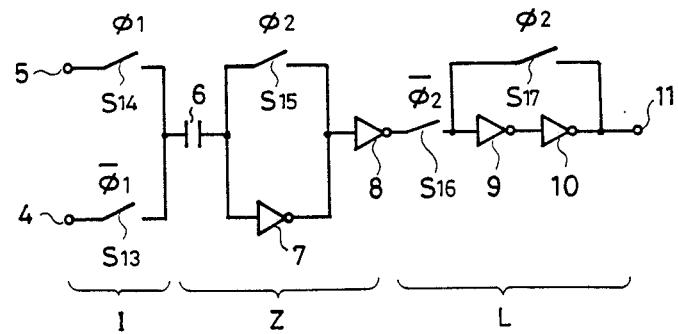
FIG. 2A is a schematic diagram showing a structure of the first voltage comparator shown in FIG. 1.
Figure 6:
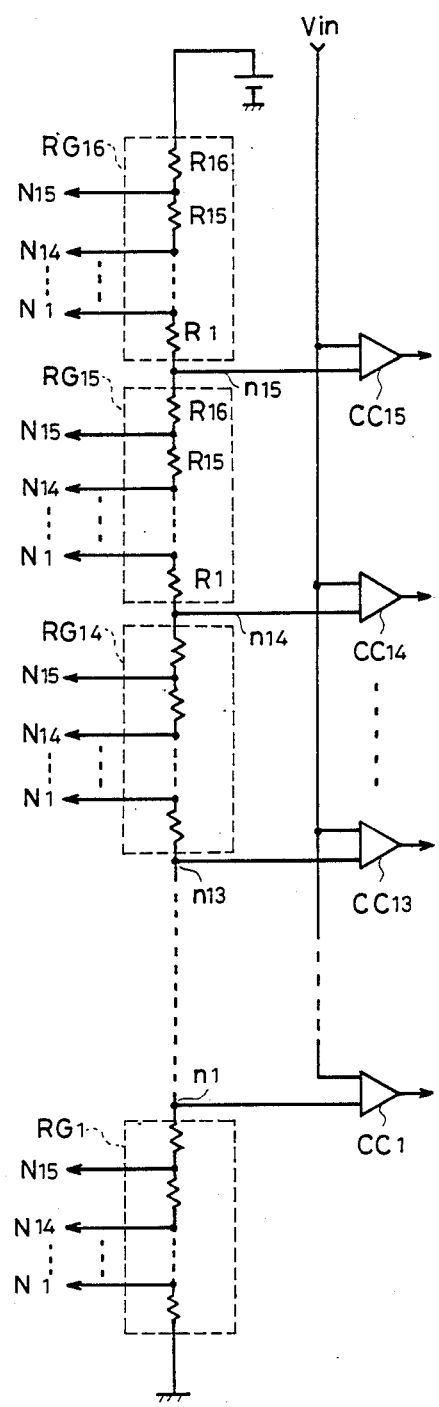
FIG. 6 is a schematic diagram mainly showing the structure of the first reference voltage generating circuit shown in FIG. 5.

In correspondence with the 8 bit structure, 15 first voltage comparators $CC1 \sim CC15$ are provided. The circuit structure of each of the first voltage comparators $CC1 \sim CC15$ is the same as that shown in FIG. 2A. Each of the register groups $RG1 \sim RG16$ constituting the first reference voltage generating circuit RG comprise series connected 16 resistances $R1 \sim R16$, as shown in FIG. 6. The nodes $n1 \sim n15$ between the register groups $RG1 \sim RG16$ are respectively connected to the first voltage comparators $CC1 \sim CC15$.

In the AD converter of this embodiment, a sifter SF is provided between the first determining circuit J1 and the first encoder E1 in the first parallel type AD converting portion 1 to determine the relation of connection therebetween, as shown in FIG. 5. In the second parallel type AD converting portion 2, two switch control circuits SCU and SCD are provided in addition to the switch control circuit SCC. The switch control circuit SCU, SCC and SCD constitute the second reference voltage generating circuit SC.

In addition, two voltage comparator groups FCU and FCD are provided in addition to the second voltage comparator group FC. The voltage comparator groups FCU, FC and FCD re connected to the first reference voltage generating circuit RG respectively through the switch control circuits SCU, SCC and SCD. A selector SL is provided between the voltage comparator groups FCU, FC and FCD and the second determining circuit J2 determining the relation of connection therebetween. The selector SL selects a set of output line group out of three sets of output line groups of the voltage comparator groups FCU, FC and FCD in response to control signals outputted from the error collecting circuit EC which will be described later, and connect the selected group to the determining circuit J2.

In the AD converter of the embodiment, an error correcting circuit EC is provided for detecting errors derived from sampling skew, and for correcting the digital output of the first parallel type AD converting portion 1 and of the second parallel type AD converting portion 2 based on the result of the detection. The error correcting circuit EC comprises a switch control circuit SC2, the third voltage comparators CE1 and CE2 and a third determining circuit J3.

Figure 7:
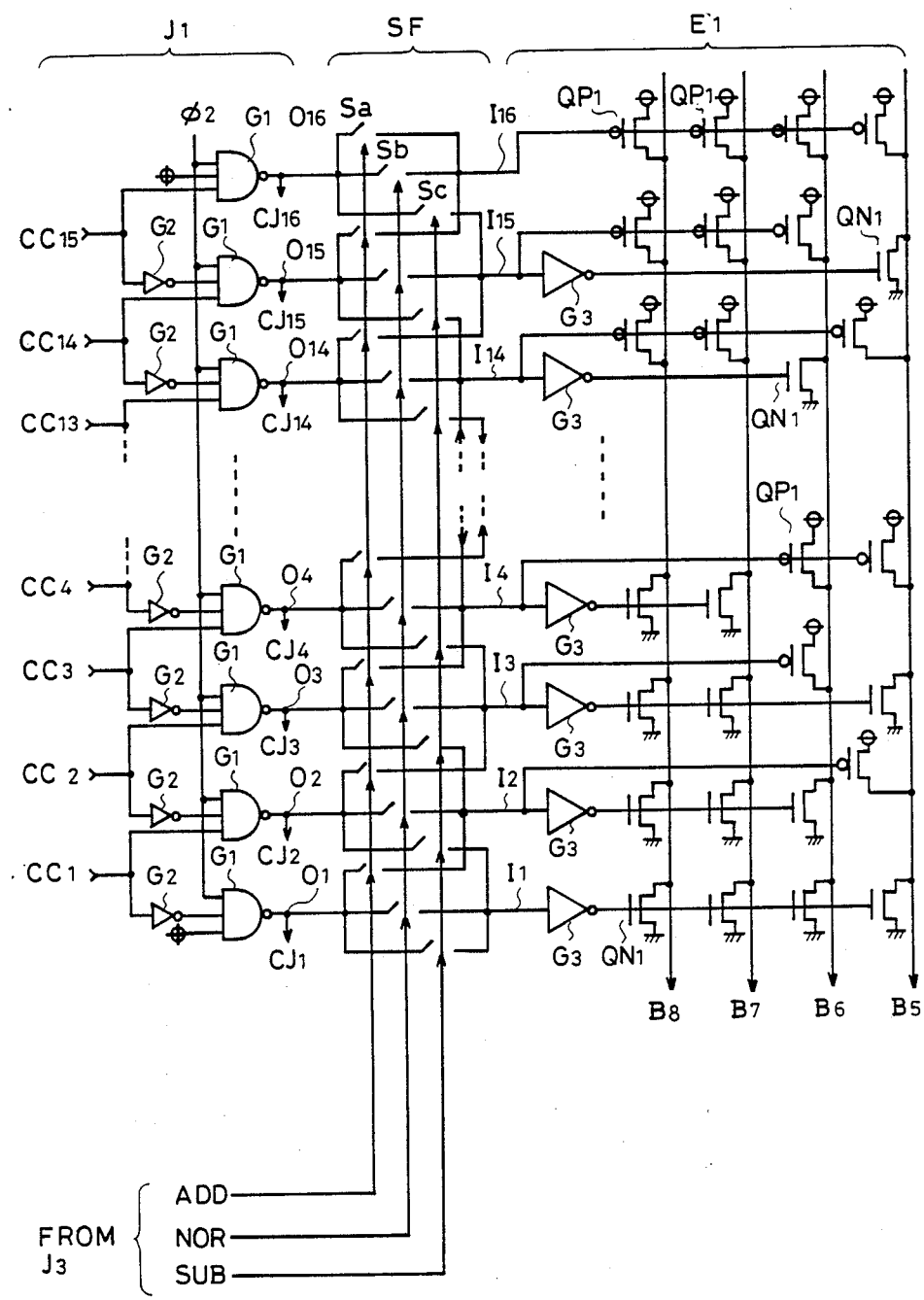
FIG. 7 is a schematic diagram showing structures of the first determining circuit, sifters, and the first encoder shown in FIG. 5.

FIG. 7 shows a definite circuit structure of the first determining circuit J1, the sifter SF and of the encoder E1 shown in FIG. 5.

The determining circuit J1 comprises 16 AND circuits G1 and 15 converters G2. The first determining circuit J1 receives the outputs from the first comparators CC1~CC15, determines which voltage range the analog input voltage Vin belongs to, and outputs an "L" level control signal from one of the output terminals 01~016. When the outputs of the comparators CC1 and CC2 are at "H" level and the outputs of the comparators CC3~CC15 are at "L" level, for example, a "L" control signal CJ3 is outputted from the output terminal 03.

Meanwhile, the first encoder E1 comprises a plurality of inverters G3, a plurality of P channel MOS transistors QP1 and a plurality of N channel MOS transistors QN1. The first encoder E1 encodes signals supplied to the input terminals I1~I16 and outputs 4 bit digital codes B5~B8.

The sifter SF comprises 16 sets of switch groups each comprising three switches Sa, Sb and Sc. The switch Sa turns on in response to a control signal ADD applied from the third determining circuit J3 which will be described later. The switch Sb turns on in response to a control signal NOR applied from the third determining circuit J3. The switch Sc turns on in response to a control signal SUB applied from the third determining circuit J3. When the switch Sb is turned on, the output terminals 01~016 of the first determining circuit J1 are respectively connected to the corresponding input terminals I1~L16 of the first encoder E1. When the switch Sa is turned on, the output terminals 01~016 of the first determining circuit J1 are connected to the input terminals of the order 1 bit higher than the corresponding input terminals I1~I16 of the first encoder E1, respectively. When the switch Sc is turned on, the output terminals 01~016 of the first determining circuit J1 are respectively connected to the input terminals of the order 1 bit lower than the corresponding input terminals I1~I16 of the first encoder E1.

Figure 8:
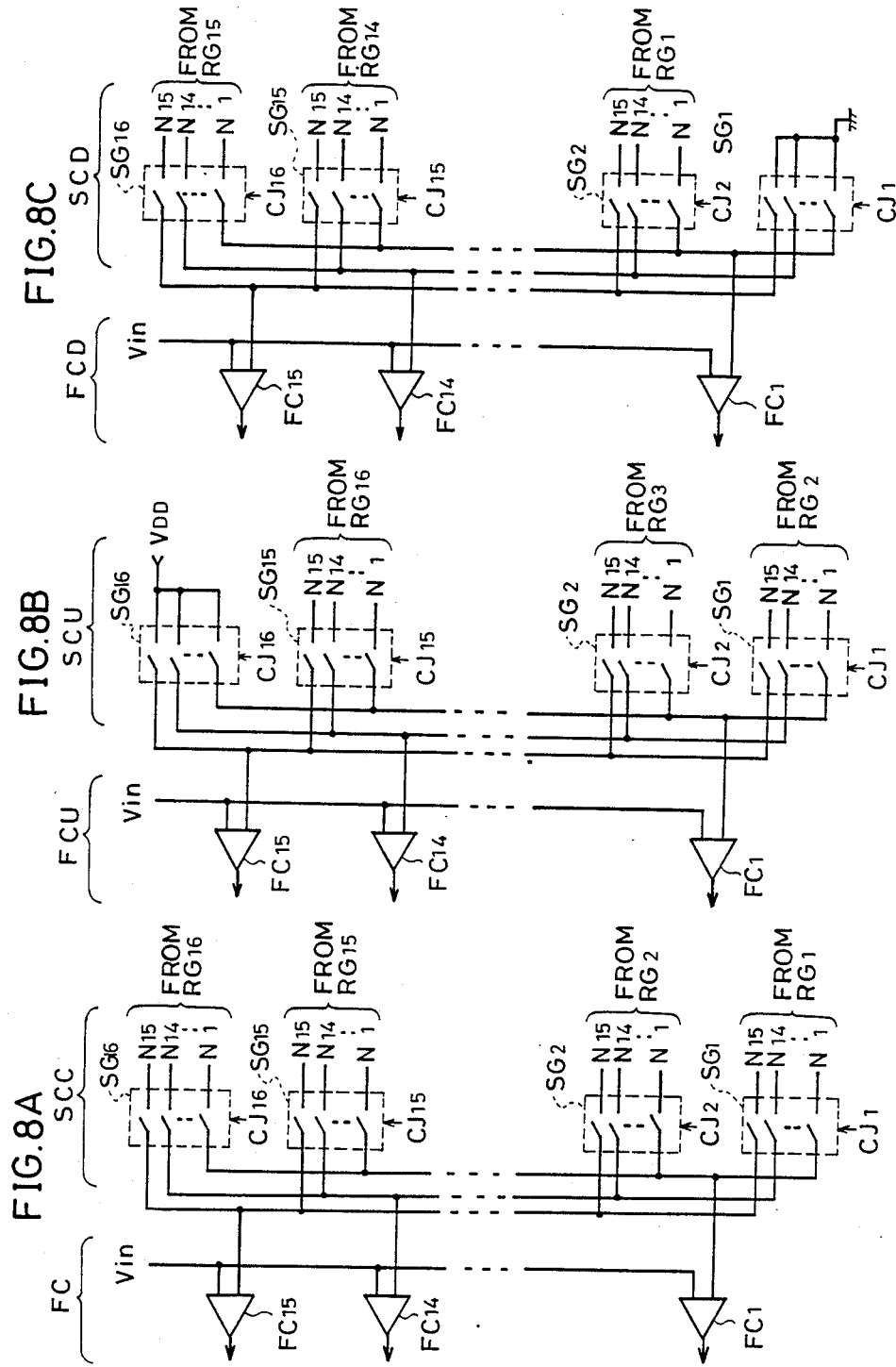
FIG. 8A is a schematic diagram showing the structures of the switch control circuit SCC and the second voltage comparator group FC shown in FIG. 5.
FIG. 8B is a schematic diagram showing the structures of the switch control circuit SCU and the second voltage comparator group FCU showing FIG. 5.
FIG. 8C is a schematic diagram showing the structures of the switch control circuit SCD and the second voltage comparator group FCD shown in FIG. 5.

FIG. 8A shows a definite circuit structure of the switch control circuit SCC and the second voltage comparator group FC; FIG. 8B shows the definite circuit structure of the switch control circuit SCU and the second voltage comparator group FCU; and FIG. 8C shows the definite circuit structure of the switch control circuit SCD and the second voltage comparator group FCD.

Figure 1:
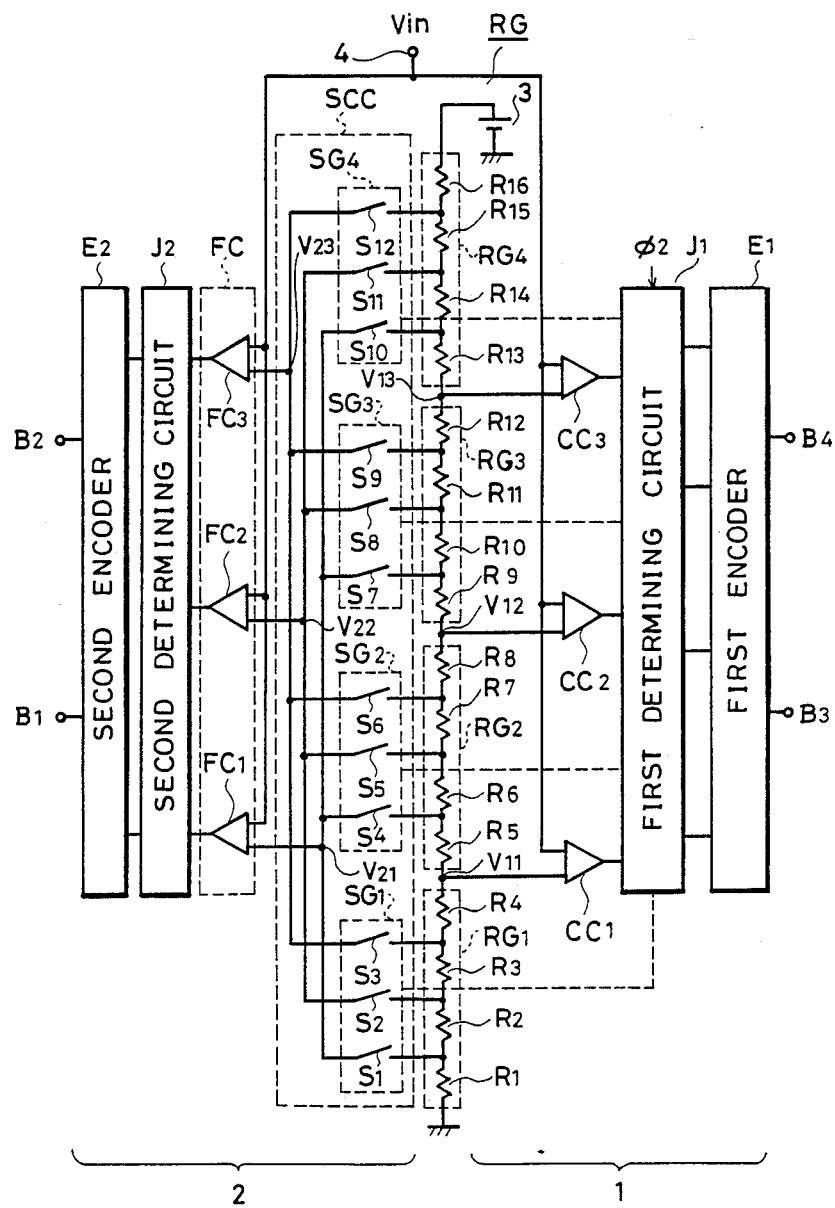
FIG. 1 is a schematic diagram showing a structure of a conventional AD converter.

The second voltage comparator group FC comprises 15 voltage comparators FC1~FC15 in correspondence with the 8 bit structure as shown in FIG. 8A. The circuit structure of each of the voltage comparators FC1~FC15 is the same as that shown in FIG. 2B. The switch control circuit SCC has almost the same structure as that of the switch control circuit SCC shown in FIG. 1, but has 16 switch groups SG1~SG16 in correspondence with the 8 bit structure. Each of the switch groups SG1~SG16 comprises 15 switches. The switch groups SG1~SG16 turn on in response to the control signals CJ1~CJ16 applied from the first determining circuit J1, respectively.

The structures of the second voltage comparator groups FCU and FCD and of the switch control circuits SCU and SCD shown in FIGS. 8B and 8C are the same as those of the second voltage comparator group FC and the switch control circuit SCC shown in FIG. 8A. However, the switches included in each of the switch groups SG1~SG16 of that switch control circuit SCC are connected to nodes N1~N15 included in each of the corresponding resistance groups shown in FIG. 6. Namely, the switch groups SG1~SG16 of the switch control circuit SCC are respectively connected to the corresponding resistance groups RG1~RG16. The switch groups SG1~SG16 of the switch control circuit SCU are respectively connected to the resistance groups of the order higher than the corresponding resistance groups RG1~RG16. The switch groups SG1~SG16 of the switch control circuit SCD are respectively connected to the resistance groups of the order lower than the corresponding resistance groups RG1~RG16.

The connection between the switch control circuits SC, SCC and SCD and the first reference voltage generating circuit RG is as follows. When it is determined that the analog input voltage Vin exists between the reference voltages V1 and V2 by the first determining circuit J1, for example, the control signal CJj is outputted from he first determining circuit J1. In response to the control signal CJj, the switch control circuit SCC is connected to 15 reference voltages in the resistance group RGj corresponding to the voltage range between the reference voltages V1 and V2; the switch control circuit SCU are connected to 15 reference voltages in the resistance group RGj+1 which is the next group on the higher potential side: and the switch control circuit SCD is connected to 15 reference voltages in the resistance group RGj −1 which is the next group on the lower potential side. Therefore, 15 voltage comparators FCj in respective voltage comparator groups FCU, FC and FCD receive 15 levels of reference voltages respectively provided from the resistance groups RGj+1, RGj and RGj −1 through the second reference voltage generating circuit SC1.

Figure 9:
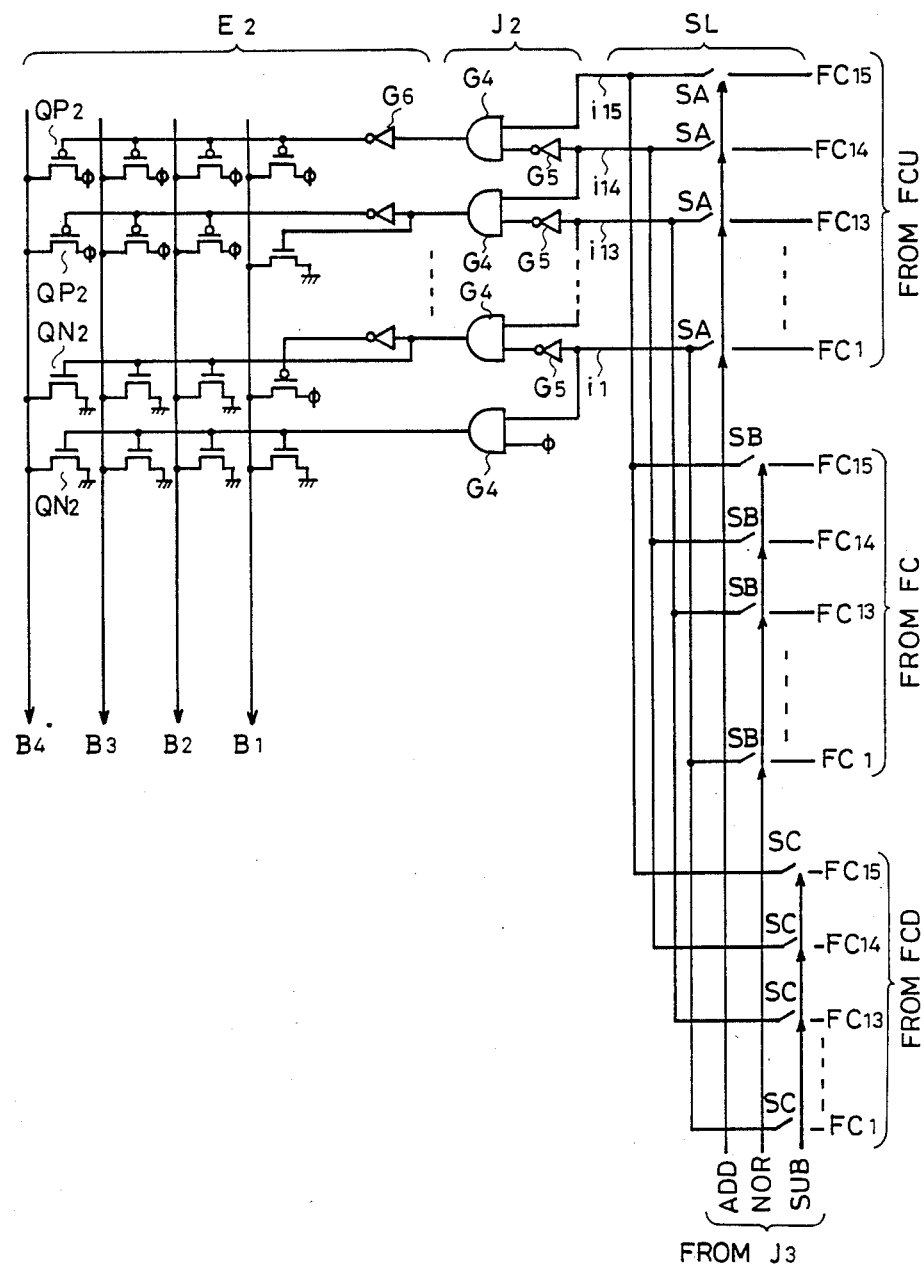
FIG. 9 a schematic diagram showing the structures of the selector, the second determining circuit and the second encoder shown in FIG. 5.

FIG. 9 shows a definite circuit structure of the selector SL, the second determining circuit J2 and the second encoder E2 shown in FIG. 5.

The second determining circuit J2 comprises a plurality of AND circuits G4 and a plurality of inverters G5. The second encoder E2 comprises a plurality of inverters G6, a plurality of P channel MOS transistors QP2 and a plurality of N channel MOS transistors QN2. The second encoder E2 encodes signals applied from the second determining circuit J2 and output digital codes B1~B4 of 4 bits. The selector SL comprises switches SA, switches SB and switches SC. The switches SA are connected between the second voltage comparators FC1~FC15 of the voltage comparator group FCU and the input terminals i1~i15 of the second determining circuit J2. The switches SB are connected between the second voltage comparators FC1~FC15 of the voltage comparator group FC and the input terminals il~i15 of the second determining circuit J2. The switches SC are connected between the second voltage comparators FC1~FC15 of the voltage comparator group FCD and the input terminals il~i15 of the second determining circuit J2. The switches SA are turned on in response to the control signal ADD applied from the third determining circuit J3 which will be described later. The switches SB are turned on in response to the control signal NOR applied from the third determining circuit J3. The switches SC are turned on in response to the control signal SUB applied from the third determining circuit J3.

Figure 10:
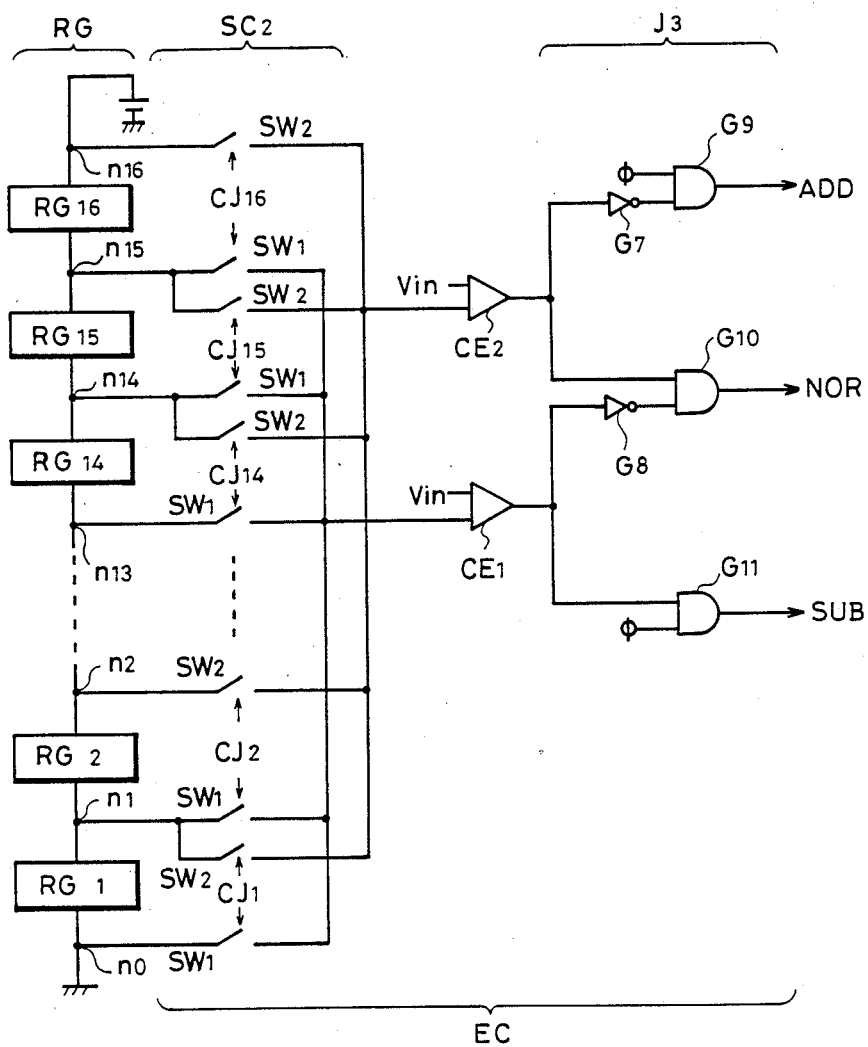
FIG. 10 is a schematic diagram showing the structure of the error correcting circuit shown in FIG. 5.

FIG. 10 shows a definite circuit structure of the error correcting circuit EC shown in FIG. 5.

Each of the nodes nl~n15 of the first reference voltage generating circuit RG is connected to one input terminal of each of the third voltage comparators CE1 and CE2 through the switches SW1 and SW2. The node n0 is connected to one input terminal of the third voltage comparator CE1 through the switch SW1. The node n16 is connected to one input terminal of the third voltage comparator CE2 through the switch SW2. The analog input voltage Vin is applied to the other input terminal of each of the third voltage comparators CE1 and CE2.

The third determining circuit J3 comprises inverters G7 and G8 and AND circuits G9~G11. One input terminal of the AND circuit G9 receives the supply voltage, and the other input terminal receives an output from the third voltage comparator CE2 through the inverter G7. One input terminal of the AND circuit G10 receives the output from the third voltage comparator CE2 and the other input terminal receives an output of the third voltage comparator CE1 through the inverter G8. One input terminal of the AND circuit G11 receives the output from the third voltage comparator CE1 and the other input terminal receives the supply voltage. The AND circuit G9 outputs the control signal ADD, the AND circuit G10 outputs the control signal NOR and the AND circuit G11 outputs the control signal SUB.

The switch control circuit SC2 selects neighboring two voltage levels out of 15 levels of reference voltages to be applied to the first stage comparators CC1~CC15 from the first reference voltage generating circuit RG in response to the control signals CJ1~CJ16 outputted from the first determining circuit J1, and applies these two to the third voltage comparators CE1 and CE2 as reference voltages. The circuit structure of the third voltage comparators CE and CE2 is the same as that shown in FIG. 2B.

When, it is determined that the analog input voltage Vin exist between the reference voltages V1 and V2 by the first determining circuit J1, for example, the control signal CJj corresponding to the determination is applied from the first determining circuit J1 to the switch control circuit SC2. Consequently, reference voltages V1 and V2 are selected as the reference voltages for the third voltage comparators CE1 and CE2 for correcting errors. The third voltage comparators CE1 and CE2 compare the analog input voltage Vin with the selected reference voltages V1 and V2, and apply the result of comparison to the third determining circuit J3. When the analog input voltage Vin exist between the reference voltages V1 and V2, an "H" level control signal NOR is outputted from the AND circuit G10. When the analog input voltage Vin is higher than the reference voltage V2, an "H" level control signal ADD is outputted from the AND circuit G9. When the analog input voltage Vin is lower than the reference voltage V1, an "H" level control signal SUB is outputted from the AND circuit G11. The control signals ADD, NOR SUB corresponding to the determination of the third determining circuit J3 are inputted to the shifter SF and the selector SL. The connections of the shifter SF and of the selector SL are determined dependent on whether the determination of the third determining circuit J3 coincides with that of the first determining circuit J1.

The clock signals $\phi 1$, $\overline{\phi 1}$ and $\phi 2$ for operating the first, second and third voltage comparators are generated by a timing generator TG shown in FIG. 5 in response to an externally applied clock signal $\phi$.

The operation of the AD converter shown in FIG. 5 will be described in the following.

Referring to FIG. 5, the analog input voltage Vin applied to the input terminal 4 is compared with 15 levels of reference voltages by the first voltage comparators CC1~CC15, and then the voltage range in which the analog input voltage Vin exist is determined by the first determining circuit J1. The above operation is the same as that of the conventional AD converter shown in FIG. 1. However, the AD converter of FIG. 1 has 4 bit structure so that there are three levels of reference voltages to be compared. Since the AD converter of the present embodiment has 8 bit structure, there are 15 levels of reference voltages to be compared.

The determination of the first determining circuit J1 is inputted as the control signals CJ1~CJ16 to the second reference voltage generating circuit SC1 and the switch control circuit SC2 serving as the third reference voltage generating means.

Consequently, the reference voltage levels, 45 levels in total, selected in the following manner are applied to the second voltage comparator groups FCU, FC and FCD, with two levels of reference voltages applied to the third voltage comparators CE1 and CE2. When it is detected that the analog input voltage Vin exists between the reference voltages V1 and V2 during the first AD converting process, for example, 15 levels of reference voltages determined by the resistance group RGj are applied through the switch control circuit SCC to the voltage comparator group FC, by the control signal CJj from the first determining circuit J1. 15 levels of reference voltages determined by the resistance group RGj+1 are applied to the voltage comparator group FCU through the switch control circuit SCU. 15 levels of reference voltages determined by the reference group RGj −1 are applied to the voltage comparator group FCD through the switch control circuit SCD. On this occasions, the reference voltages V1 and V2 are respectively applied to the third voltage comparators CE1 and CE2 through the switch control circuit SC2 in response to the control signal CJj from the first determining circuit J1.

Figure 2B:
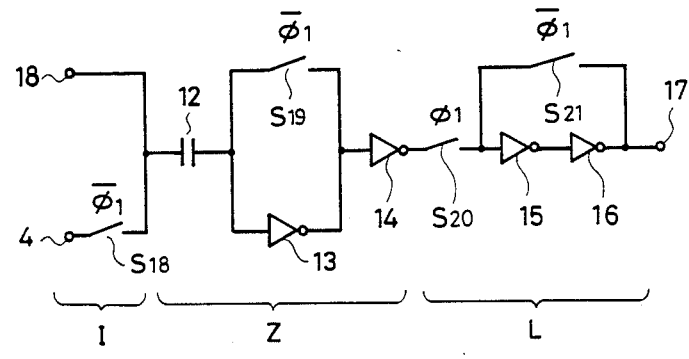
FIG. 2B is a schematic diagram showing a structure of the second voltage comparator shown in FIG. 1.

Since the third voltage comparators CE1 and CE2 and the second voltage comparators FC1~FC15 in the voltage comparator groups FCU, FC and FCD all have the structure shown in FIG. 2B, there is no sampling skew of the analog input voltage Vin among these comparators. Therefore, the third voltage comparators CE1 and CE2 again compare the analog input voltage Vin with both ends, that is, the upper limit and the lower limit of the voltage range to which the analog input voltage belongs, which is detected in the first AD converting process. Namely, the comparison of the voltage by the third voltage comparators CE1 and CE2 is carried out at the same timing as the second parallel type AD converting portion 2 with no sampling skew of the analog input voltage Vin. The result of comparison is inputted to the third determining circuit J3. The third determining circuit J3 applies the control signal ADD, NOR or SUB to the shifter SF and the selector SL based on the result of comparison.

The operation of the shifter, SF and the selector SL in response to the control signals ADD, NOR and SUB from the error correcting circuit EC will be described in the following. In the following description, it is assumed that the analog input voltage Vin is detected existing between the reference voltages V1 and V2 during the first AD converting process.

(1) when it is determined that the analog input voltage Vin exists at a voltage level higher than the reference voltage V2 in the error correction circuit EC;

The output terminals 01~016 of the first determining circuit J1 are connected to the input terminals on the side 1 bit higher than the corresponding input terminals I1~I16 of the first encoder E1 by the shifter SF, in response to the control signal ADD from the error correcting circuit EC (FIG. 7). Consequently, a digital output is provided which comprises the data detected in the first AD converting process plus 1 bit. At the same time, the output from the second voltage comparators FC1~FC15 of the voltage comparator group FCU are connected to the second determining circuit J2 through the selector SL in response to the control signal ADD from the error correcting circuit EC (FIG. 9). Consequently, the analog input voltage Vin is compared with that reference voltage group applied by the resistance group RGj+1 which is in the voltage range with the potential higher than that of the voltage range detected in the first AD converting process by the minimum resolution of the first parallel type AD converting portion 1. Consequently, the voltage range in which the analog input voltage Vin exists is determined by the determining circuit J2, with the result of determination encoded by the second encoder E2 to be outputted as a digital value.

(2) when it is determined that the analog input voltage Vin exists between the reference voltages V1 and V2 in the error correcting circuit EC;

The output terminals 01~016 of the first determining circuit J1 are connected to the corresponding input terminals I1~I16 of the first encoder E1 through the shifter SF in response to the control signal NOR from the error correcting circuit EC, whereby digital outputs are obtained. At the same time, the output from the second voltage comparators FC1~FC15 of the voltage comparator group FC are connected to the two input terminals i1~i15 of the second determining circuit J2 through the selector SL in response to the control signal NOR from the error correcting circuit. The output of the second determining circuit J is encoded by the second encoder E2 to be outputted as a digital value.

(3) when it is determined that the analog input voltage Vin exists at a voltage level lower than the reference voltage V1 in the error correcting circuit EC;

The output terminals 01~016 of the first determining circuit J1 are connected to the input terminals 1 bit lower than the corresponding input terminals I1~I16 of the first encoder E1 by the shifter SF in response to the control signal SUB from the error correcting circuit EC. Consequently, the digital output is provided which comprises the data detected in the first AD conversion process minus 1 bit. At the same time, the second voltage comparators FC1~FC15 of the voltage comparator group FCD are connected to the input terminals i1~i15 of the second determining circuit J2 through the selector SL in response to the control signal SU from the error correcting circuit EC. The output of the second determining circuit J2 is encoded by the second encoder E2 to be outputted as a digital value As described above, in the present embodiment, the output of the first determining circuit J1 of the first parallel type AD converting portion 1 is utilized as a preliminary detecting signal of the range of existence of the analog input voltage Vin, and in addition, an error correcting circuit EC is employed, whereby the AD converting process by the first parallel type AD converting portion 1 can be corrected. The disadvantages of the conventional AD converters can be eliminated in this manner.

The third voltage comparators CE1 and CE2 of the error correcting circuit EC have the same circuit structure as that of the second voltage comparators FC1~FC15 of the second parallel type AD converting portion 2, so that there is no sampling skew between these comparators. Therefore, errors derived from the sampling skew in the first parallel type AD converting portion can be corrected by the error collecting circuit EC.

In the second parallel type AD converting portion 2, the voltage comparator groups FCU And FCD and the switch control circuits SCU and SCD are newly provided. Consequently, extra comparison of voltage of the LSB of the first parallel type AD converting portion 1 can be carried out respectively in the higher potential side and lower potential side of the range in which the analog input voltage exists detected in the first AD converting process. Therefore, even if an error is generated in the data detected in the first AD converting process, a correct digital code is outputted from the second parallel type AD converting portion 2. The error correction is carried out by the control signals ADD, NOR and SUB from the error correcting circuit EC to the selector SL.

Figure 4:
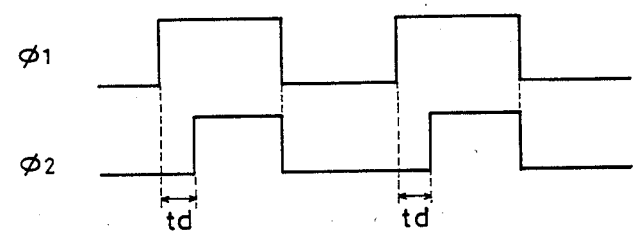
FIG. 4 is a timing diagram illustrating other operations of the conventional AD converter.
Figure 3A:
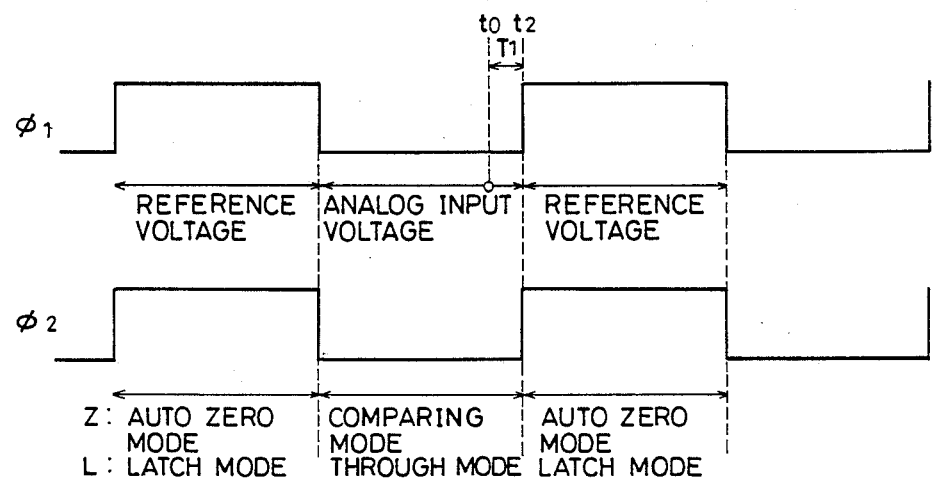
FIG. 3A is a timing diagram illustrating the operation of the first voltage comparators shown in FIG. 2A.
Figure 3B:
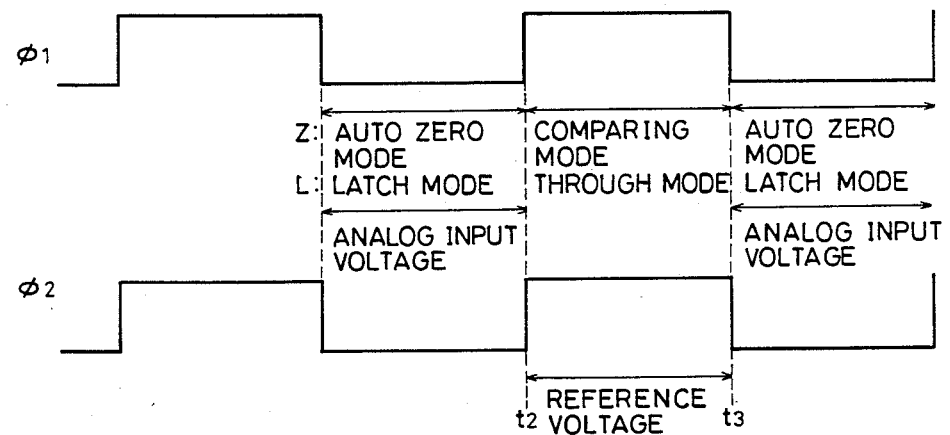
FIG. 3B is a timing diagram illustrating the operation of the second voltage comparators shown in FIG. 2B.

In the above described embodiment, the voltage comparison excessive by 2 LSB of the 4 bit structure first parallel type AD converting portion 1 is carried out. Consequently, errors derived from the sampling skew of 16 LSB can be corrected, as compared with a case in which a conventional serial-parallel type AD converter is structured with 8 bits. Therefore, when a ramp wave having the frequency of 5 MHz is applied as the analog input voltage Vin with the delay time T1 of the amplifying stage Z (FIG. 2A) of the first voltage comparator CCj assumed to be 10 ns, the timing adjustment such as shown in FIG. 4 can be dispensed with, whereby the speed of operation AD converter is increased.

By increasing the number of the third voltage comparators in the error correcting circuit EC, the analog input voltage Vin may be compared with large number of first reference voltages and the range of comparison of voltage in the second parallel type AD converting portion 2 may be further enlarged. By doing so, the speed of operation of the AD converter can be increased even when the above mentioned delay time T1 becomes longer and the input signal band is enlarged.

In the above described embodiment, a 8 bit serial-parallel type AD converter comprising a 4-bit-structure first parallel type AD converting portion 1 and a 4-bit-structure second parallel type AD converting portion 2 is disclosed. However, the present invention is not limited to this type, and it may be applied to the n bit serial-parallel type AD converter comprising the first parallel type AD converting portion 1 of m1 bits and the second parallel type AD converting portion 2 of m2 bits (where m1, m2 and n are natural numbers).

Since the shifter SF and the selector SL formed of a plurality of switches are employed for collecting errors in the above describe AD converter, it can operate at high speed. More specifically, in a method of correcting output of the encoder using an adder, there will be a delay caused by carry propagation. When the shifter SF and selector SL are used as described above, there will be no carry propagation, so that there is no delay generated in the operation.

Figure 10A:
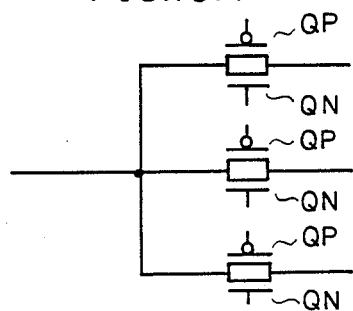
FIG. 10A is a schematic diagram showing the structure of switches included in the sifter and the selector.

The plurality of switches included in the shifter SF and the selector SL are constituted by transfer gates formed of P channel MOS transistors QP and N channel MOS transistors QN, for example, as shown in FIG. 10A. If the number of bits is small, the number of transistors constituting the shifter SF and the selector SL may be smaller than that of the transistors constituting the adder. Consequently, the area occupied by the AD converter can be made small.

Figure 11A:
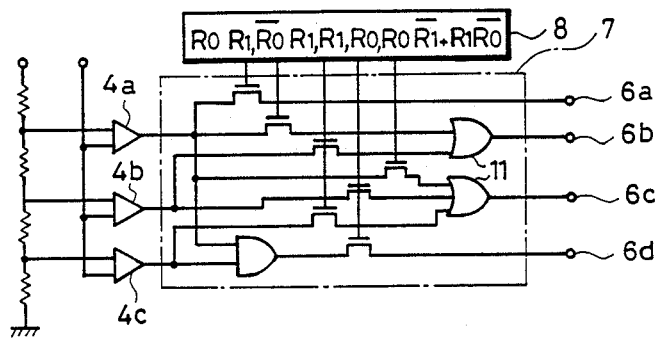
FIG. 11A show an example of a circuit for outputting a result of multiplication using a signal which is not yet encoded.
Figure 11B:
FIG. 11B illustrates the operation of the circuit of FIG. 11A.

In addition, in the above described AD converter, the error correction is carried out before encoding, thereby providing additional value. It is advantageous when a signal which is not yet encoded is used for multiplication with other digital input to output the result of multiplication, for example. Namely, as shown in FIGS. 11A and 11B, by providing the control portion 7 and the control signal generating portion 8, the result of multiplication of the output from the comparators 4a, 4b, and 4c with the digital inputs R0 and R1 can be provided from the output terminals 6a~6d.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An AD converter converting an analog input voltage to a digital signal, comprising:
a first parallel type AD converting portion, including
first reference voltage generating means providing a plurality of first reference voltages by equally dividing a prescribed reference voltage,
a plurality of first voltage comparing means each comparing said analog input voltage with each of said plurality of first reference voltages in a first manner of operation,
first determining means detecting a first voltage range to which said analog input belongs out of a plurality of first voltage ranges distinguished by said plurality of first reference voltages, in response to outputs of said plurality of first voltage comparing means,
first encoder means determining higher order bits of a digital signal in response to an output from said first determining means, and
first connection determining means provided between said first determining means and said first encoder means for determining relation of connection therebetween;
a second parallel type AD converting portion, including
second reference voltage generating means providing a plurality of second reference voltages by equally dividing a voltage range including the first voltage range detected by said first determining means,
a plurality of second voltage comparing means each comparing said analog input voltage with each of said plurality of second reference voltages in a second manner of operation,
second determining means detecting a second voltage range to which said analog input voltage belongs out of a plurality of second voltage ranges distinguished by said plurality of second reference voltages, in response to outputs from said plurality of second voltage comparing means, and
second encoder means determining lower order bits of a digital signal in response to an output from said second determining means; and
error correcting means, including
means for selecting first reference voltages encompassing said first voltage range detected by said first determining means out of said plurality of first reference voltages,
a plurality of third voltage comparing means each comparing said analog input voltage with each of the first reference voltages selected by said selecting means in said second manner of operation which is the same as that of said second voltage comparing means, and
third determining means detecting a voltage range to which said analog input voltage belongs out of a plurality of voltage ranges distinguished by the first reference voltage selected by said selecting means in response to outputs from said plurality of third voltage comparing means to apply a control signal determining said relation of connection to said first connection determining means.

2. An AD converter according to claim 1, wherein said first determining means comprises
a plurality of input terminals receiving outputs of said plurality of first voltage comparing means, and
a plurality of output terminals corresponding to said plurality of first voltage ranges, and
said first determining means outputs a detection signal to an output terminal out of said plurality of output terminals, which terminal corresponds to a first voltage range to which said analog input voltage belongs.

3. An AD converter according to claim 2, wherein said first encoder means comprises a plurality of input terminals corresponding to said plurality of output terminals of said first determining means, and
converts signals applied to said plurality of input terminals to digital codes.

4. An AD converter according to claim 3, wherein
said control signal from said third determining means comprises a first control signal, a second control signal and a third control signal;
said third determining means outputs
said first control signal when said analog input voltage belongs to a first voltage range corresponding to said detecting signal,
said second control signal when said analog input voltage belongs to a first voltage range higher than the first voltage range corresponding to said detecting signal, and
said third control signal when said analog input voltage belongs to a first voltage range lower than the first voltage range corresponding to said first detecting signal.

5. An AD converter according to claim 4, wherein
said second reference voltage generating means comprises
a first reference voltage generating portion providing a plurality of second reference voltages by equally dividing the first voltage range detected by said first determining means,
a second reference voltage generating portion providing a plurality of second reference voltages by equally dividing a first voltage range higher than the first voltage range detected by said first determining means, and
a third reference voltage generating portion providing a plurality of second reference voltages by equally dividing a first voltage range lower than the first voltage range detected by said first determining means:
said plurality of second voltage comparing means are divided into
a first group comprising a plurality of second voltage comparing means each comparing said analog input voltage with each of said plurality of second reference voltages provided from said first reference voltage generating portion,
a second group comprising a plurality of second voltage comparing means each comparing said analog input voltage with each of said plurality of second reference voltages provided from said second reference voltage generating portion, and
a third group comprising a plurality of second voltage comparing means each comparing said analog input voltage with each o said plurality of second reference voltages provided from said third reference voltage generating portion:
said AD converter further comprises second connection determining means provided between said plurality of second voltage comparing means and said second determining means, connecting the first group of said plurality of second voltage comparing means to said second determining means in response to said first control signal from said third determining means; connecting the second group of said plurality of second voltage comparing means to said second determining means in response to said second control signal from said third determining means; and connecting the third group of said plurality of second voltage comparing means to said second determining means in response to said third control signal from said third determining means.

6. An AD converter according to claim 5, wherein said second connection determining means comprises
first switch means responsive to said first control signal for connecting the first group of said plurality of second voltage comparing means to said second determining means,
second switch means responsive to said second control signal for connecting the second group of said plurality of second voltage comparing means to said second determining means, and
third switch means responsive to said third control signal for connecting the third group of said second voltage comparing means to said second determining means.

7. An AD converter according to claim 5, wherein
said second reference generating means further comprises a plurality of voltage dividing means each equally dividing said plurality of first voltage range to provide said plurality of second reference voltages;
said first reference voltage generating portion comprises a plurality of fourth switch means, each responsive to said detecting signal from the corresponding output terminal of said first determining means for applying said plurality of second reference voltages provided from the corresponding one of said plurality of voltage dividing means to the first group of said plurality of second voltage comparing means;
said second reference voltage generating portion comprises a plurality of fifth switch means, each responsive to said detecting signal from the corresponding output terminal of said first determining means for applying said plurality of second reference voltages provided from voltage dividing means on a side of higher voltage than the corresponding one of said plurality of voltage dividing means to said second group of said plurality of second voltage comparing means; and
said third reference voltage generating portion comprises a plurality of sixth switch means, each responsive to said detecting signal from the corresponding output terminal of said first determining means for applying said plurality of second reference voltages provided from voltage dividing means on a side of lower voltage than the corresponding one of said plurality of voltage dividing means to the third group of said plurality of second voltage comparing means.

8. An AD converter according to claim 5, wherein said first connection determining means comprises
seventh switch means responsive to said first control signal for connecting said plurality of output terminals of said first determining means respectively to corresponding input terminals of said first encoder means,
eighth switch means responsive to said second control signal for connecting said plurality of output terminals of said first determining means respectively to input terminals on higher voltage side than the corresponding input terminals of said first encoder means,
ninth switch means responsive to said third control signal for connecting said plurality of output terminals of said first determining means respectively to input terminals on lower voltage side than the corresponding input terminals of said first encoder means.

9. An AD converter according to claim 1, wherein each of said plurality of first, second and third voltage comparing means comprises an input stage selectively inputting said analog input voltage and said first o second reference voltage, an amplifying stage.which is selectively set at a comparing mode in which a difference between said analog input voltage and said first or second reference voltage inputted by said input stage is amplified, and at an auto zero mode in which the amplify stage is biased to a prescribed voltage, and a latch stage which is selectively set at a through mode in which an output of said amplifying stage is passed through and at a latch mode in which the output of said amplifying stage is latched:

in said first manner of operation said first reference voltage is inputted by said input stage, said amplifying stage is set at said auto zero mode and said latch stage is set at latch mode, at a first timing, said analog input voltage is inputted by said input stage, said amplifying stage is set at said comparing mode and said latch stage is set at said through mode at a second timing:

in said second manner of operation said analog voltage is inputted by said input stage, said amplifying stage is set at said auto zero mode and said latch stage is set at said latch mode, at said second timing, and said first or second reference voltage is inputted by said input stage, said amplifying stage is set at said comparing mode and said latch stage is set at said through mode, at a third timing.

* * * * *